(12) United States Patent
Chen et al.

(10) Patent No.: US 7,515,238 B2
(45) Date of Patent: Apr. 7, 2009

(54) ELECTRONIC BONDING STRUCTURE WITH SEPARATELY DISTRIBUTED ANISOTROPIC CONDUCTIVE FILM UNITS AND LIQUID CRYSTAL PANEL HAVING SAME

(75) Inventors: Kuan-Hsin Chen, MiaoLi (TW);
Keng-Ming Lai, MiaoLi (TW);
Chih-Hung Hsiao, MiaoLi (TW);
Min-Cheng Wang, MiaoLi (TW)

(73) Assignee: Innolux Display Corp., Miao-Li County (TW)

( * ) Notice: Subject to any disclaimer, the term of this patent is extended or adjusted under 35 U.S.C. 154(b) by 286 days.

(21) Appl. No.: 11/516,341

(22) Filed: Sep. 6, 2006

(65) Prior Publication Data

US 2007/0052905 A1 Mar. 8, 2007

(51) Int. Cl.
*G02F 1/1345* (2006.01)
(52) U.S. Cl. .................... 349/149; 349/150
(58) Field of Classification Search .......... 349/149–152
See application file for complete search history.

(56) References Cited

U.S. PATENT DOCUMENTS

| 6,031,590 | A | 2/2000 | Kim |
| 6,981,317 | B1 * | 1/2006 | Nishida ................ 29/840 |
| 2005/0153599 | A1 * | 7/2005 | Wu et al. ............. 439/591 |
| 2005/0168426 | A1 * | 8/2005 | Moon et al. ............ 345/98 |

* cited by examiner

*Primary Examiner*—Charlie Peng
(74) *Attorney, Agent, or Firm*—Wei Te Chung

(57) ABSTRACT

An exemplary liquid crystal panel (100) includes a first substrate (110), a second substrate (120) opposite to the first substrate, a liquid crystal layer (130) sandwiched between the first and second substrates, a plurality of drive integrated circuits (ICs) (114), and a plurality of anisotropic conductive film (ACF) units (115). The first substrate includes a source bonding region (117) and a gate bonding region (118) at the periphery thereof. Each of the source bonding region and the gate bonding region includes a plurality of connecting regions and a plurality of spacing regions each between two connecting regions. The ACF units are disposed on the connecting regions of the source bonding region and the gate bonding region, and are configured for bonding the drive ICs onto the first substrate.

6 Claims, 5 Drawing Sheets

US 7,515,238 B2

ELECTRONIC BONDING STRUCTURE WITH SEPARATELY DISTRIBUTED ANISOTROPIC CONDUCTIVE FILM UNITS AND LIQUID CRYSTAL PANEL HAVING SAME

FIELD OF THE INVENTION

The present invention relates to electronic bonding structures typically used in liquid crystal panels, and particularly to an electronic bonding structure having a plurality of separately distributed anisotropic conductive film (ACF) units that respectively bond a plurality of electronic components thereon.

GENERAL BACKGROUND

A typical liquid crystal display (LCD) is capable of displaying a clear and sharp image through millions of pixels that make up the complete image. The liquid crystal display has thus been applied to various electronic equipment in which messages or pictures need to be displayed, such as mobile phones and notebook computers.

A liquid crystal display generally includes a plurality of pixel regions defined by a plurality of gate lines that are parallel to each other and a plurality of data lines that are parallel to each other and orthogonal to the gate lines. The liquid crystal display also includes a plurality of thin film transistors (TFTs), each of which is provided in the vicinity of a respective point of intersection of the gate lines and the data lines. Each pixel region includes a pixel electrode. The TFTs function as switching elements of the pixel electrodes. The gate lines are driven by a gate drive integrate circuit (IC). The data lines are driven by a data drive IC. The gate drive IC and the data drive IC are bonded on a printed circuit board (PCB) of the LCD. The gate drive IC and the data drive IC each connect with a respective flexible printed circuit board (FPC) via circuits on the PCB. The FPCs are separately bonded on the PCB. Mechanical and electrical connections between the gate and data drive ICs, the FPCs, and the PCB are achieved by anisotropic conductive films (ACFs).

Referring to FIG. 7, a typical LCD 1 includes a liquid crystal panel 10, a backlight module 20 adjacent the liquid crystal panel 10 for illuminating the liquid crystal panel 10, and a frame 30 accommodating the liquid crystal panel 10 and the backlight module 20. The frame 30 includes two separate pieces that are snap-fitted together to hold the liquid crystal panel 10 and the backlight module 20 therein.

Referring also to FIG. 8, the liquid crystal panel 10 includes a first substrate 11, a second substrate 12, and a liquid crystal layer 13 sandwiched between the first and second substrates 11, 12. Two adjacent edge portions of the first substrate 11 cooperatively define an L-shaped bonding region which is covered by an anisotropic conductive film (ACF) 15. The ACF 15 generally includes a polymer resin film having a plurality of conductive particles distributed therein. An isolation film is removably adhered on the polymer resin film. The isolation film is removed when the ACF 15 is ready to have electronic components attached thereon.

Referring also to FIG. 9, a plurality of drive ICs 14 of the LCD 1 are fixed and electrically connected to the first substrate 11 by the ACF 15. A process of bonding the drive ICs 14 on the ACF 15 generally includes the steps of: pressing the ACF 15 on the bonding region of the first substrate 11 in a low temperature environment; removing the isolation film of the ACF 15; disposing the drive ICs 14 on the ACF 15; and pressing the drive ICs 14 in a high temperature environment to fix and electrically connect the drive ICs 14 to the first substrate 11. The bonding region includes a plurality of connecting regions for supporting the drive ICs 14, and a plurality of spacing regions each defined between two adjacent connecting regions. The connecting regions include a plurality of connecting pins or bumps, which electrically connect with data lines and gate lines of the LCD 1.

The connecting pins or bumps of the gate lines and the data lines distributed in the connecting regions of the first substrate 11 result in the connecting regions being more elevated than the spacing regions. In the hot pressing process, a pressure produced by a pressing apparatus cannot be fully transmitted to the ACF 15 on the spacing regions, so that the bonding between the ACF 15 and the first substrate 11 in the spacing regions is relatively weak. Furthermore, when the isolation film of the ACF 15 is removed, portions of the ACF 15 on the spacing regions may be accidentally stripped off from the first substrate 11. This can also result in weakened bonding between the ACF 15 and the first substrate 11 in the connecting regions. Moreover, the ACF 15 in the spacing regions is not used or needed for connecting the drive ICs 14 to the first substrate 11. Because the ACF 15 is in general quite expensive, the cost of the LCD 1 is unduly high.

Therefore, a new electronic bonding structure that can overcome the above-described problems is desired. A liquid crystal panel having the electronic bonding structure is also desired.

SUMMARY

In a preferred embodiment, a liquid crystal panel includes a first substrate, a second substrate opposite to the first substrate, a liquid crystal layer sandwiched between the first and second substrates, a plurality of drive integrated circuits (ICs), and a plurality of anisotropic conductive film (ACF) units. The ACF units are separately disposed on the bonding region of the first substrate, and are configured for bonding the drive ICs onto the first substrate.

Other advantages and novel features will become more apparent from the following detailed description when taken in conjunction with the accompanying drawings.

DETAILED DESCRIPTION OF PREFERRED EMBODIMENTS

Figure 1:
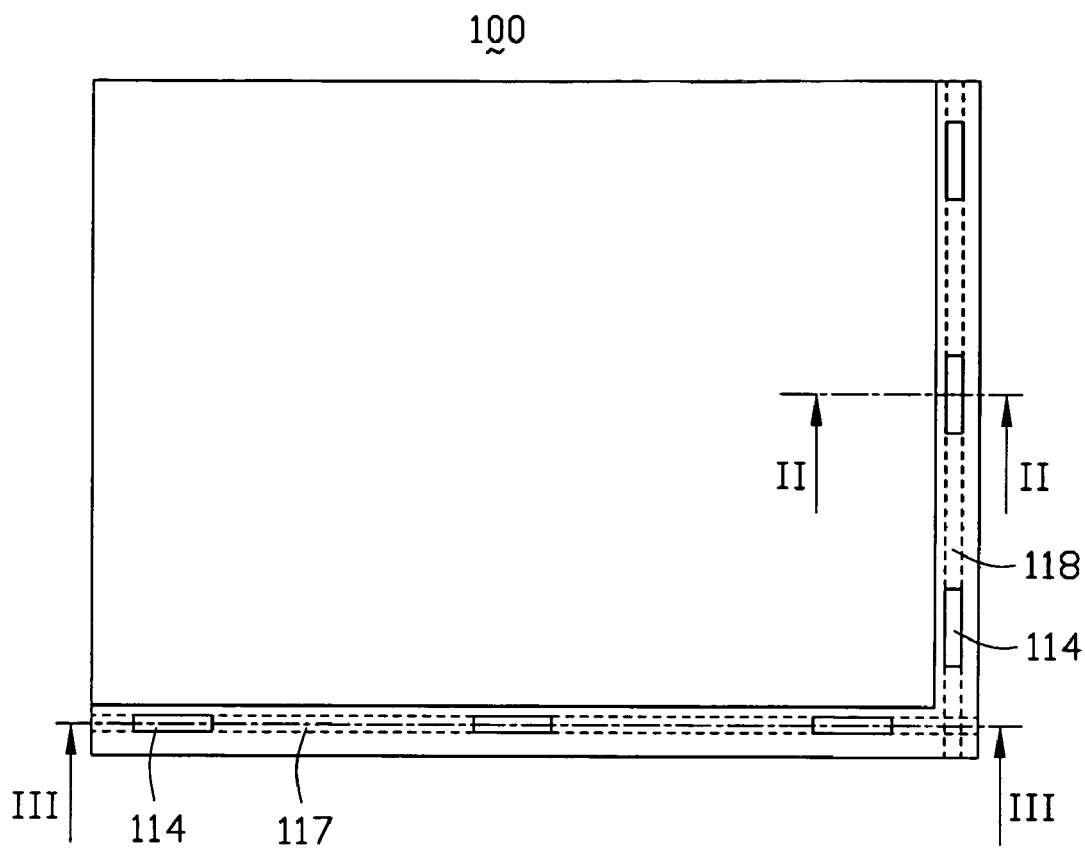
FIG. 1 is a top view of a liquid crystal panel according to a first embodiment of the present invention.
Figure 2:
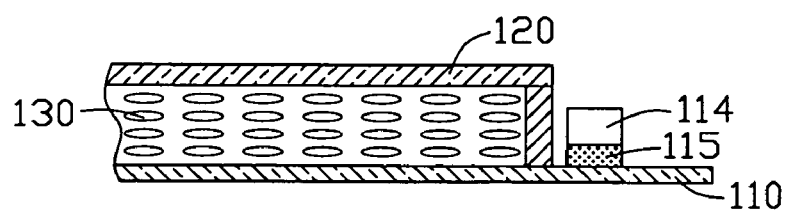
FIG. 2 is an enlarged, cross-sectional view taken along line II-II of FIG. 1.
Figure 3:
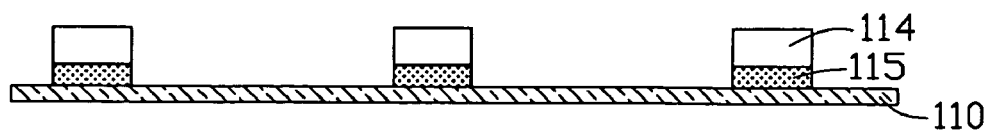
FIG. 3 is a cross-sectional view taken along line III-III of FIG. 1.

Referring to FIGS. 1, 2 and 3, a liquid crystal panel 100 according to a first embodiment of the present invention includes a first substrate 110, a second substrate 120 opposite to the first substrate 110, and a liquid crystal layer sandwiched between the first and second substrates 110, 120. The first substrate 110 includes a source bonding region 117 and a gate bonding region 118, which are respectively located at two adjacent edges of the first substrate 110. The two bonding regions 117, 118 each include a plurality of connecting regions for supporting drive ICs 114, and a plurality of spacing regions each defined between two adjacent connecting regions. Each of the connecting regions of the source bonding region 117 includes a plurality of connecting pins (or bumps), which electrically connect with data lines of the liquid crystal panel 100 via circuitry on the first substrate 110. Each of the connecting regions of the gate bonding region 118 includes a plurality connecting pins (or bumps), which electrically connect with gate lines of the liquid crystal panel 100 via circuitry on the first substrate 110. A plurality of ACF units 115 are disposed at the connecting regions of the two bonding regions 117, 118 of the first substrate 110. The drive ICs 114 are fixed and electrically connected to the connecting pins of the first substrate 110 by respective of the ACF units 115.

For example, in one kind of 17-inch liquid crystal panel 100, there are ten drive ICs 114 bonded on the source bonding region 117, and four drive ICs 114 bonded on the gate bonding region 118. Conventionally, an ACF having an area of 513.6 square millimeters is needed to cover the connecting regions and the spacing regions of the first substrate 110. In the first embodiment of the present invention, the ACF units 115 having a total area of 260.2 square millimeters is enough for covering the connecting regions of the first substrate 110. In another one kind of 14-inch liquid crystal panel 100, there are eight drive ICs 114 bonded on the source bonding region 117, and three drive ICs 114 bonded on the gate bonding region 118. Conventionally, an ACF having an area of 428.7 square millimeters is needed to cover the connecting regions and the spacing regions of the first substrate 110. In the first embodiment of the present invention, the ACF units 115 having a total area of 202.9 square millimeters is enough for covering the connecting regions of the first substrate 110. That is, the amount of ACF material needed for the liquid crystal panel 100 is greatly reduced in the first embodiment. Thus, the cost of the liquid crystal panel 100 is correspondingly decreased.

Moreover, because the ACF units 115 are only disposed on the connecting regions, during a low temperature bonding process in which the ACF units 115 are pressed on the first substrate 110, entire areas of all the ACF units 115 are firmly bonded to the first substrate 110. Therefore when isolation films of the ACF units 115 are subsequently removed, there is little or no risk of portions of the ACF units 115 being accidentally stripped off. That is, the bonding between the ACF units 115 and the connecting regions of the first substrate 110 remains intact.

Figure 4:
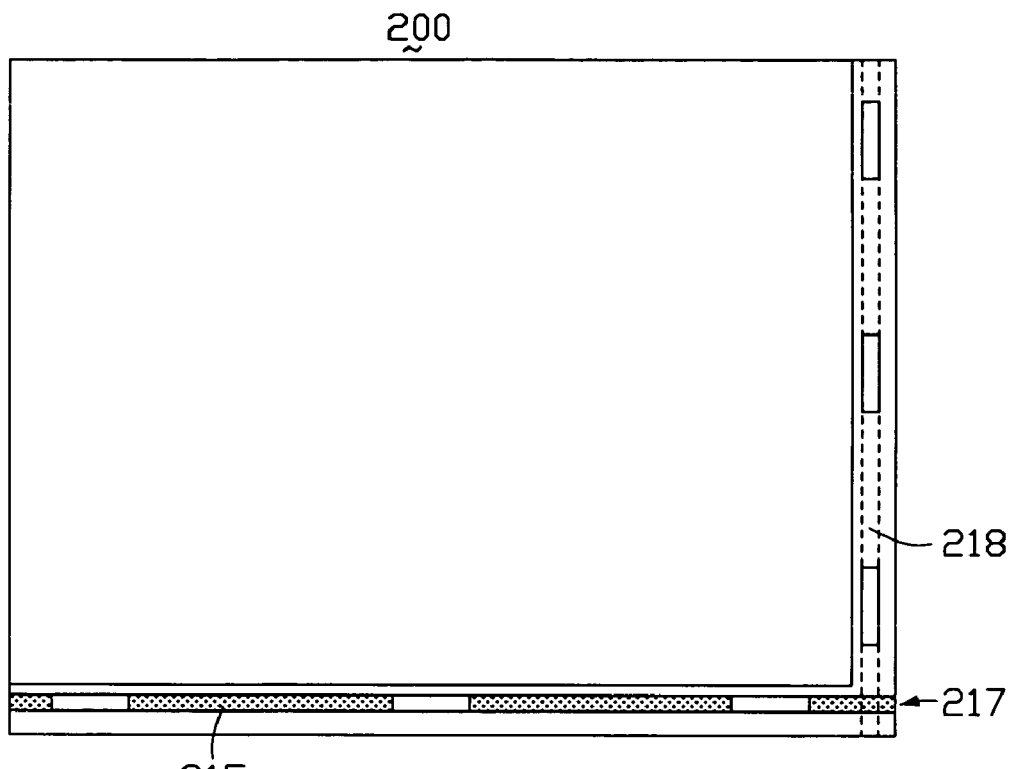
FIG. 4 is a top view of a liquid crystal panel according to a second embodiment of the present invention.

Referring to FIG. 4, a liquid crystal panel 200 according to a second embodiment of the present invention is similar to the liquid crystal panel 100 of the first embodiment. However, in the liquid crystal panel 200, a plurality of ACF units 215 are disposed on a whole source bonding region 217, and on connecting regions only of a gate bonding region 218.

Figure 5:
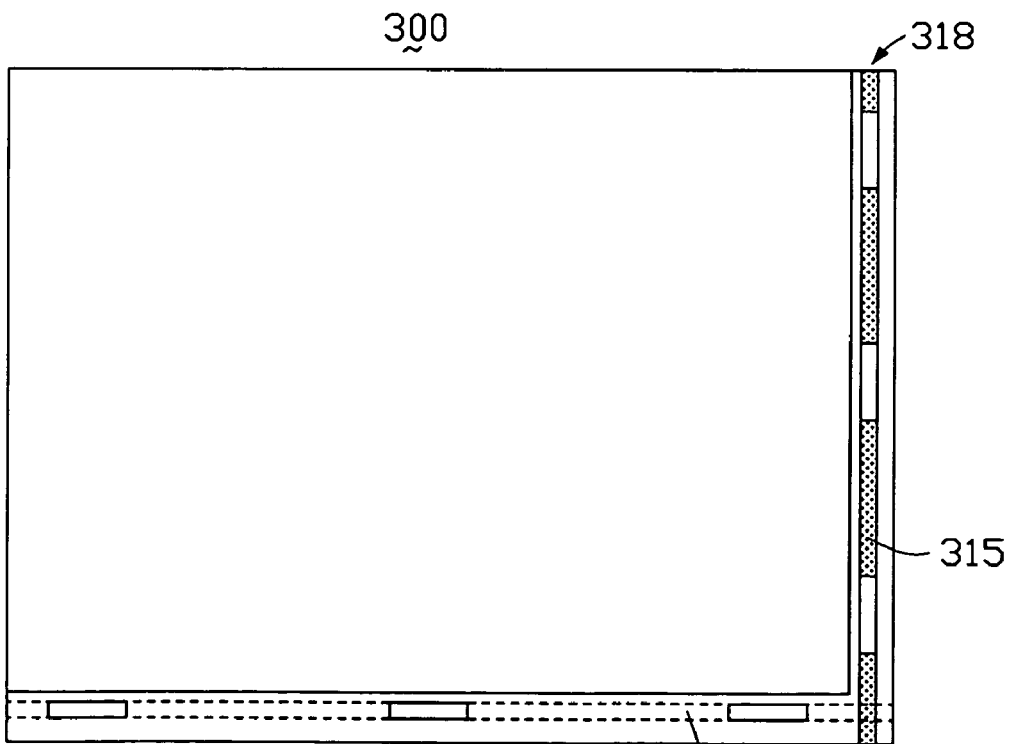
FIG. 5 is a top view of a liquid crystal panel according to a third embodiment of the present invention.

Referring to FIG. 5, a liquid crystal panel 300 according to a third embodiment of the present invention is similar to the liquid crystal panel 100 of the first embodiment. However, in the liquid crystal panel 300, a plurality of ACF units 315 are disposed on a whole gate bonding region 318, and on connecting regions only of a source bonding region 317.

Figure 6:
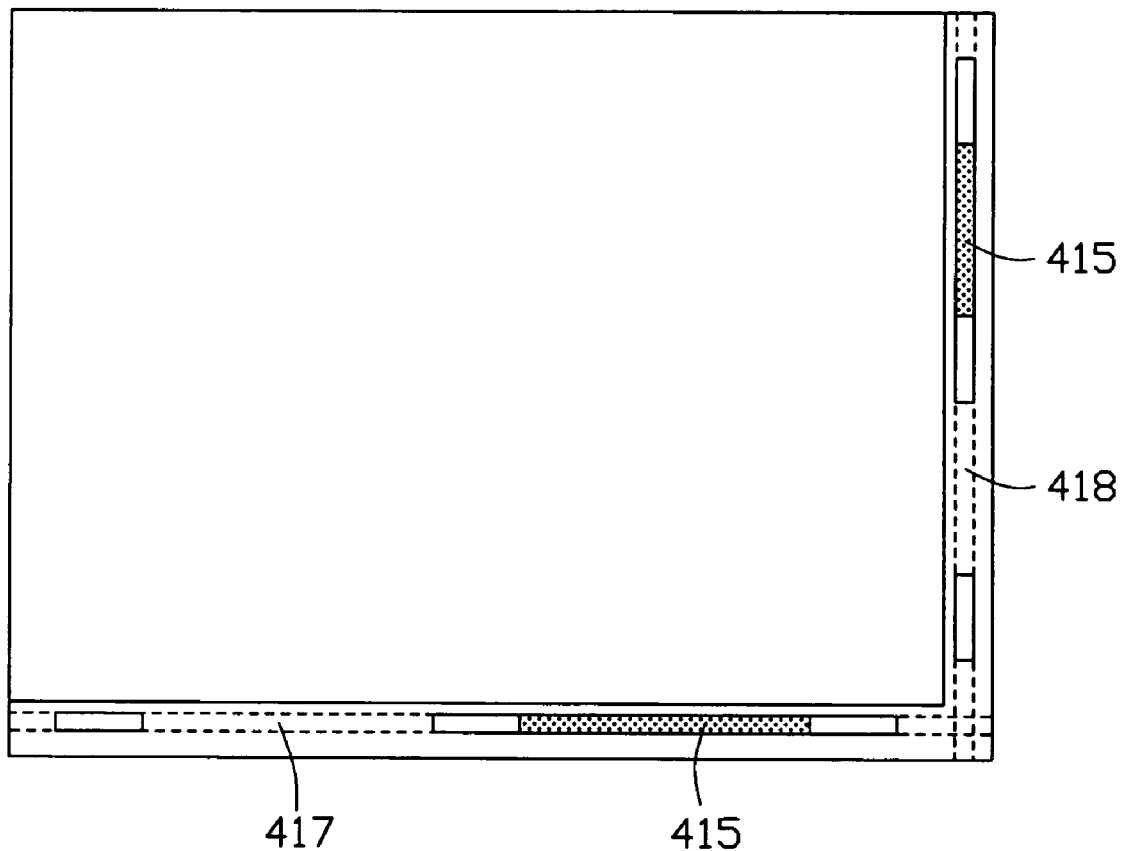
FIG. 6 is a top view of a liquid crystal panel according to a fourth embodiment of the present invention.
Figure 7:
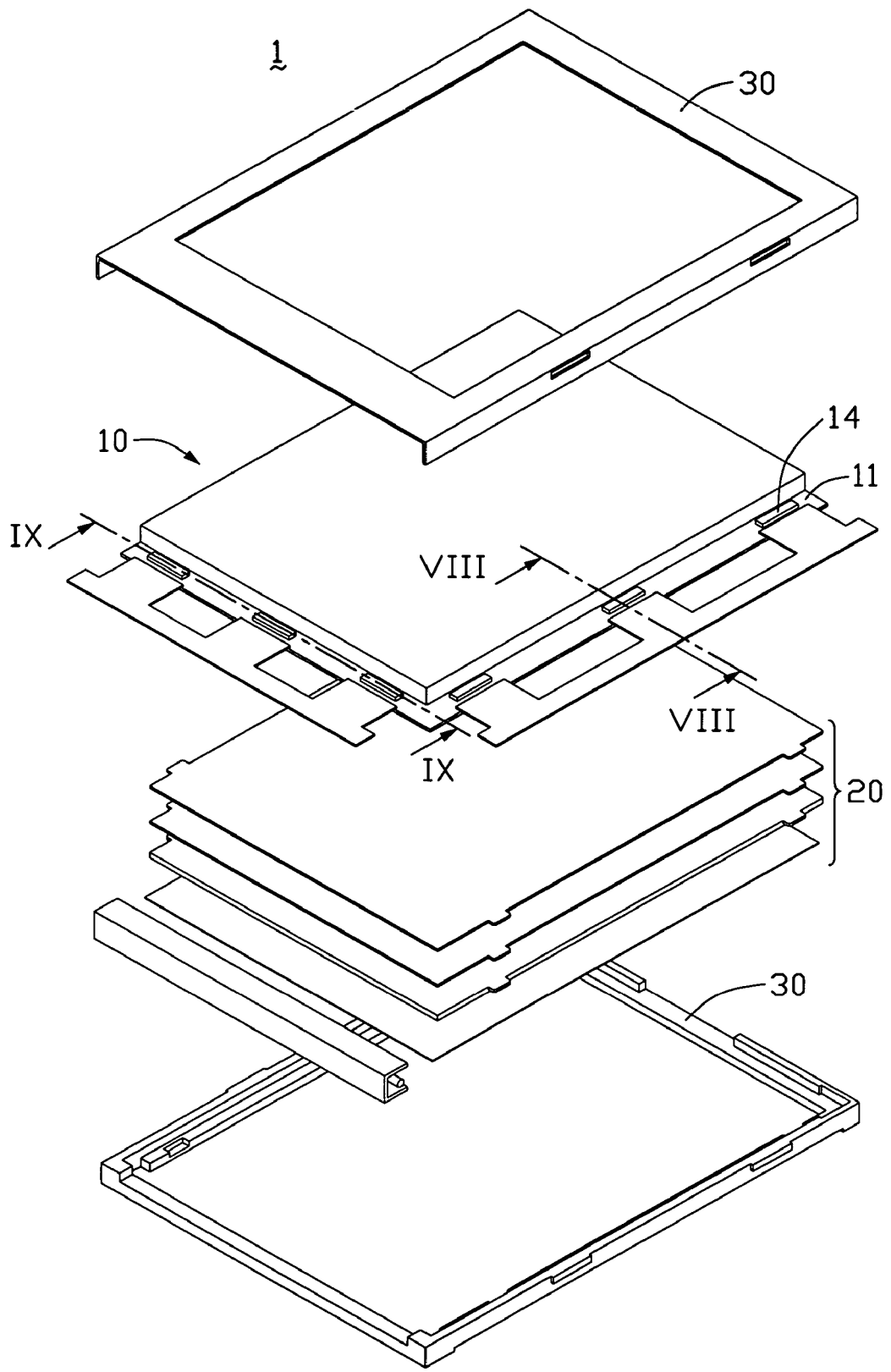
FIG. 7 is an exploded, isometric view of a conventional liquid crystal display.
Figure 8:
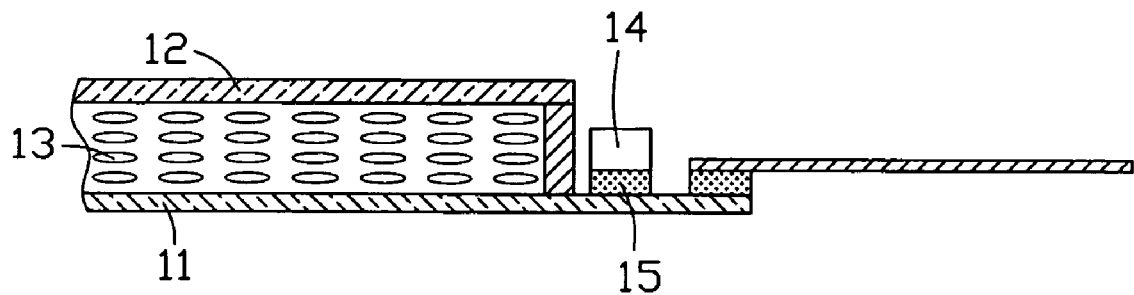
FIG. 8 is an enlarged, cross-sectional view taken along line VIII-VIII of FIG. 7.
Figure 9:
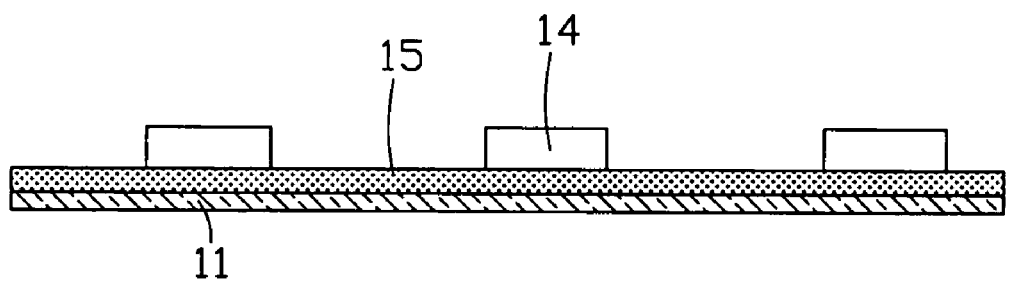
FIG. 9 is an enlarged, cross-sectional view taken along line IX-IX of FIG. 7.

Referring to FIG. 6, a liquid crystal panel 400 according to a fourth embodiment of the present invention is similar to the liquid crystal panel 100 of the first embodiment. However, in the liquid crystal panel 400, a plurality of ACF units 415 are disposed on all connecting regions and on parts of spacing regions of a source bonding region 417, and on all connecting regions and on parts of spacing regions of a gate bonding region 418.

Further or alternative embodiments may include the following. The above-described bonding configurations can be used in other applications, such as bonding a flexible printed circuit board (FPC) onto an LCD substrate, bonding an FPC onto a printed circuit board (PCB), and so on.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A liquid crystal panel comprising:
    a first substrate having a bonding region, the bonding region comprising a source bonding region and a gate bonding region, each of the source bonding region and the gate bonding region comprising a plurality of connecting regions and a plurality of spacing regions each between two adjacent connecting regions, each of the connecting regions of the source bonding region comprising a plurality of connecting pins which electrically connect with data lines of the liquid crystal panel, each of the connecting regions of the gate bonding region comprising a plurality of connecting pins which electrically connect with gate lines of the liquid crystal panel;
    a second substrate opposite to the first substrate;
    a liquid crystal layer sandwiched between the first and second substrates;
    a plurality of drive integrated circuits (ICs); and
    a plurality of anisotropic conductive film units separately disposed on the whole gate bonding region and on the connecting regions only of the source bonding region, and configured for bonding the drive ICs to the first substrate.

2. The liquid crystal panel as claimed in claim 1, wherein the bonding region is defined at the periphery of the substrate.

3. A liquid crystal panel comprising:
    a first substrate having a bonding region, the bonding region comprising a source bonding region and a. gate bonding region, each of the source bonding region and the gate bonding region comprising a plurality of connecting regions and a plurality of spacing regions each between two adjacent connecting regions, each of the connecting regions of the source bonding region comprising a plurality of connecting pins which electrically connect with data lines of the liquid crystal panel, each of the connecting regions of the gate bonding region comprising a plurality of connecting pins which electrically connect with gate lines of the liquid crystal panel;
    a second substrate opposite to the first substrate;
    a liquid crystal layer sandwiched between the first and second substrates;
    a plurality of drive integrated circuits (ICs); and
    a plurality of anisotropic conductive film units separately disposed on the whole source bonding region and on the connecting regions only of the gate bonding region, and configured for bonding the drive ICs to the first substrate.

4. The liquid crystal panel as claimed in claim 3, wherein the bonding region is defined at the periphery of the substrate.

5. A liquid crystal panel comprising:
a first substrate baying a bonding region, the bonding region comprising a source bonding region and a gate bonding region, each of the source bonding region and the gate bonding region comprising a plurality of connecting regions and a plurality of spacing regions each between two adjacent connecting regions, each of the connecting regions of the source bonding region comprising a plurality of connecting pins which electrically connect with data lines of the liquid crystal panel, each of the connecting regions of the gate bonding region comprising a plurality of connecting pins which electrically connect with gate lines of the liquid crystal panel;
a second substrate opposite to the first substrate;
a liquid crystal layer sandwiched between the first and second substrates;
a plurality of drive integrated circuits (Ics); and
a plurality of anisotropic conductive film units separately disposed on all connecting regions and on parts of the spacing regions of the source bonding region, and on all connecting regions and on parts of the spacing regions of the gate bonding region, and configured for bonding the drive ICs to the first substrate.

6. The liquid crystal panel as claimed in claim 4, wherein the bonding region is defined at the periphery of the substrate.

* * * * *